(12) United States Patent  (10) Patent No.: US 6,519,742 B1
Falk  (45) Date of Patent: Feb. 11, 2003

(54) LOCAL NAMING FOR HDL COMPILATION

(75) Inventor: William E. Falk, Saratoga, CA (US)

(73) Assignee: Synplicity, Inc., Sunnyvale, CA (US)

( * ) Notice: Subject to any disclaimer, the term of this patent is extended or adjusted under 35 U.S.C. 154(b) by 0 days.

(21) Appl. No.: 09/519,321

(22) Filed: Mar. 6, 2000

(51) Int. Cl.$^7$ .............................................. G06F 17/50
(52) U.S. Cl. ............................................. 716/3; 716/18
(58) Field of Search .................................. 716/3, 18, 1

(56) References Cited

U.S. PATENT DOCUMENTS

| | | | | |
|---|---|---|---|---|
| 5,841,663 A | * | 11/1998 | Sharma et al. ............... | 364/490 |
| 6,021,266 A | * | 2/2000 | Kay ........................ | 395/500.03 |
| 6,132,109 A | * | 10/2000 | Gregory et al. ............. | 395/704 |
| 6,237,127 B1 | * | 5/2001 | Craven et al. .................. | 716/6 |
| 6,295,517 B1 | * | 9/2001 | Roy et al. ..................... | 703/15 |
| 6,311,317 B1 | * | 10/2001 | Khoche et al. ................ | 716/18 |
| 6,321,366 B1 | * | 11/2001 | Tseng et al. .................... | 716/6 |

OTHER PUBLICATIONS

Dr. SY Wong Adaware, "Hardware/Sofware Co–Design Language Compatible with VHDL," IEEE, Sep. 1998, pp. 78–83.*

Soderman et al, "Implementing C Designs in Hardware: A Full–Featured ANSI C to RTL Verilog Compiler in Action," IEEE, Mar. 1998, pp. 22–29.*

* cited by examiner

Primary Examiner—Vuthe Siek
(74) Attorney, Agent, or Firm—Blakely, Sokoloff, Taylor & Zafman

(57) ABSTRACT

In one embodiment, a circuit element is described in text representation in a HDL source code file. The text representation is provided to a synthesis compiler for compilation. The text representation contains multiple expressions describing the logic circuits. During synthesis compilation, object names are selected for each expression in the text representation. The object names are derived from local counters and from the expressions depending on the context of the expressions such that a revision of one section of the source HDL text only affects the object names of the expressions local to the revised section. The object names of other sections of the source HDL text are not affected and remain the same.

62 Claims, 6 Drawing Sheets

| HDL SOURCE CODE TEXT EXPRESSION | OPERATOR OBJECT NAME |
|---|---|
| A = B + C | I1 |
| X = Y * 2 | I2 |

FIG. 3A
(PRIOR ART)

| HDL SOURCE CODE TEXT EXPRESSION | OPERATOR OBJECT NAME |
|---|---|
| X = Y * 2 | I1 |
| A = B + C | I2 |

FIG. 3B
(PRIOR ART)

| HDL SOURCE CODE TEXT EXPRESSION | OPERATOR OBJECT NAME |
|---|---|
| A = B + C | A3 |
| X = Y * 2 | X5 |

FIG. 5A

| HDL SOURCE CODE TEXT EXPRESSION | OPERATOR OBJECT NAME |
|---|---|
| X = Y * 2 | X5 |
| A = B + C | A3 |

FIG. 5B

LOCAL NAMING FOR HDL COMPILATION

FIELD OF THE INVENTION

The present invention relates generally to the field of circuit design synthesis, and more particularly to circuit design synthesis through hardware description language.

BACKGROUND OF THE INVENTION

For the design of digital circuits on the scale of VLSI (Very Large Scale Integration) technology, designers often employ computer-aided techniques. Standard languages known as Hardware Description Languages (HDL's) have been developed to describe digital circuits to aid in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL), or the behavioral level using abstract data types. As device technology continues to advance, various product design tools have been developed to adapt HDLs for use with newer devices and design styles.

In designing circuits using HDL compilers, designers first describe circuit elements in HDL source code and then compile the source code to produce synthesized RTL netlists. The RTL netlists correspond to schematic representations of the circuit elements. The circuits containing the synthesized circuit elements are often optimized to improve timing relationships and eliminate unnecessary or redundant logic elements. Such optimization typically involves substituting different gate types or combining and eliminating gates in the circuit, and often results in re-ordering the hierarchies and relationships between the original RTL objects and the underlying source code that produced the RTL objects.

Since object generation can happen during many different phases of synthesis, naming the objects in a consistent way is a challenge. Typical present circuit synthesis systems use a simple global counter mechanism and a fixed prefix to generate object names. Such implementation is inflexible because the generated names, such as instance names and net names, are not repeatable from one synthesis run to the next. This causes problems with repeatability, analysis, debug, incremental design, floorplanning and partitioning.

SUMMARY OF THE INVENTION

The present invention discloses methods and apparatuses that determine object names by analyzing the local context and using that information to generate repeatable names.

In one embodiment, a circuit element is described in text representation in a HDL source code file. The text representation is provided to a synthesis compiler for compilation. The text representation contains multiple expressions describing the logic circuits. During a synthesis compilation, object names are selected for each expression in the text representation. The object names are derived from local counters and from the expressions depending on the context of the expressions such that a revision of one section of the source HDL text only affects the object names of the expressions local to the revised section. The object names of other sections of the source HDL text are not affected and remain the same.

The present invention provides computer systems which are capable of performing methods of the invention, and the invention also provides computer readable material which, when executed on a digital processing system, such as a computer system, causes the system to execute one or more of the methods of the invention.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 3A is a table that illustrates the prior art object naming convention by a synthesis compiler after one synthesis of a source code.

FIG. 3B is a table that illustrates the prior art object naming convention by a synthesis compiler after another synthesis of the revised source code.

FIG. 5A is a table that illustrates the object naming convention by a synthesis compiler after one synthesis of a source code, according to one embodiment of the present invention.

FIG. 5B is a table that illustrates the object naming convention by a synthesis compiler after a second synthesis of the revised source code, according to one embodiment of the present invention.

DETAILED DESCRIPTION

A system for determining object names by analyzing the local context and using that information to generate a repeatable name is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form to facilitate explanation.

Figure 1:
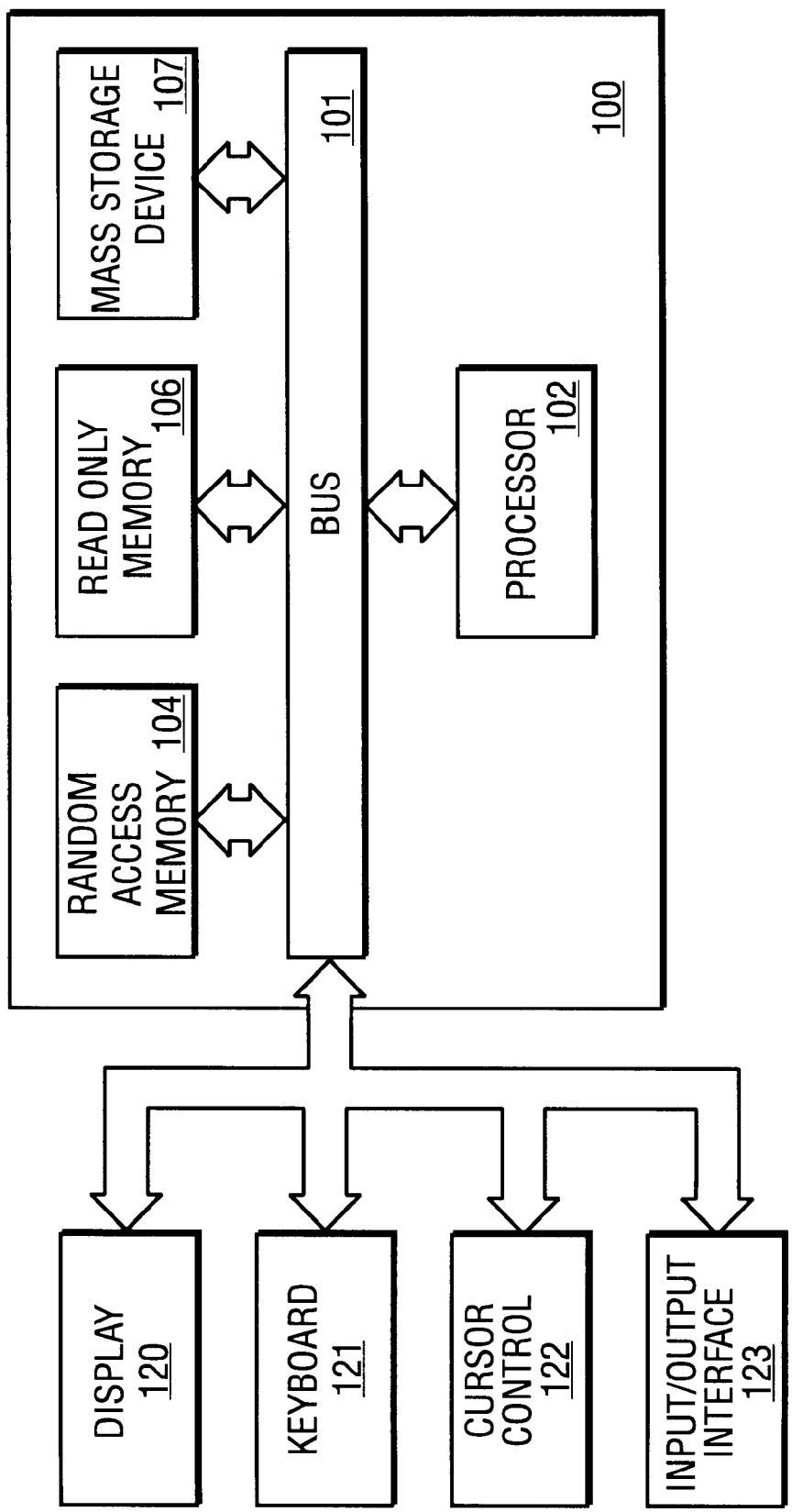
FIG. 1 is a block diagram of a computer system that may be used to implement an embodiment of the present invention.

FIG. 1 illustrates a block diagram of a computer system that may be used to implement an embodiment of the present invention. The computer system is used to perform logic synthesis of a design that is described in an HDL. The computer system 100 includes a processor 102 coupled through a bus 101 to a random access memory (RAM) 104, a read only memory (ROM) 106, and a mass storage device 107. Mass storage device 107 represents a persistent data storage device, such as a floppy disk drive, fixed disk drive (e.g., magnetic, optical, magneto-optical, or the like), or streaming tape drive. Processor 102 may be embodied in a general-purpose processor (such as the Intel™ Pentium® processor), a special purpose processor, or a specifically programmed logic device.

Display device 120 is coupled to processor 102 through bus 101 and provides graphical output for computer system 100. Keyboard 121 and cursor control unit 122 are coupled to bus 101 for communicating information and command selections to processor 102. Also coupled to processor 102 through bus 101 is an input/output (I/O) interface 123 which can be used to control and transfer data to electronic devices (printers, other computers, etc.) connected to computer 100.

It should be noted that the architecture of FIG. 1 is provided only for purposes of illustration, and that a computer used in conjunction with the present invention is not limited to this specific architecture.

A method of one embodiment of the present invention preserves the object names such as, for example, instance names and net names, from one synthesis run to the next. An embodiment of the present invention is intended for use with hardware description language (HDL) design synthesis software, although the invention is not limited to such use. Although use with other languages and computer programs, which are used for logic synthesis, is possible, embodiments of the present invention will be described in the context of use in HDL synthesis systems. In order to provide a context for a description of embodiments of the present invention, an example of a logic synthesis process from HDL source code will be described.

Figure 2:
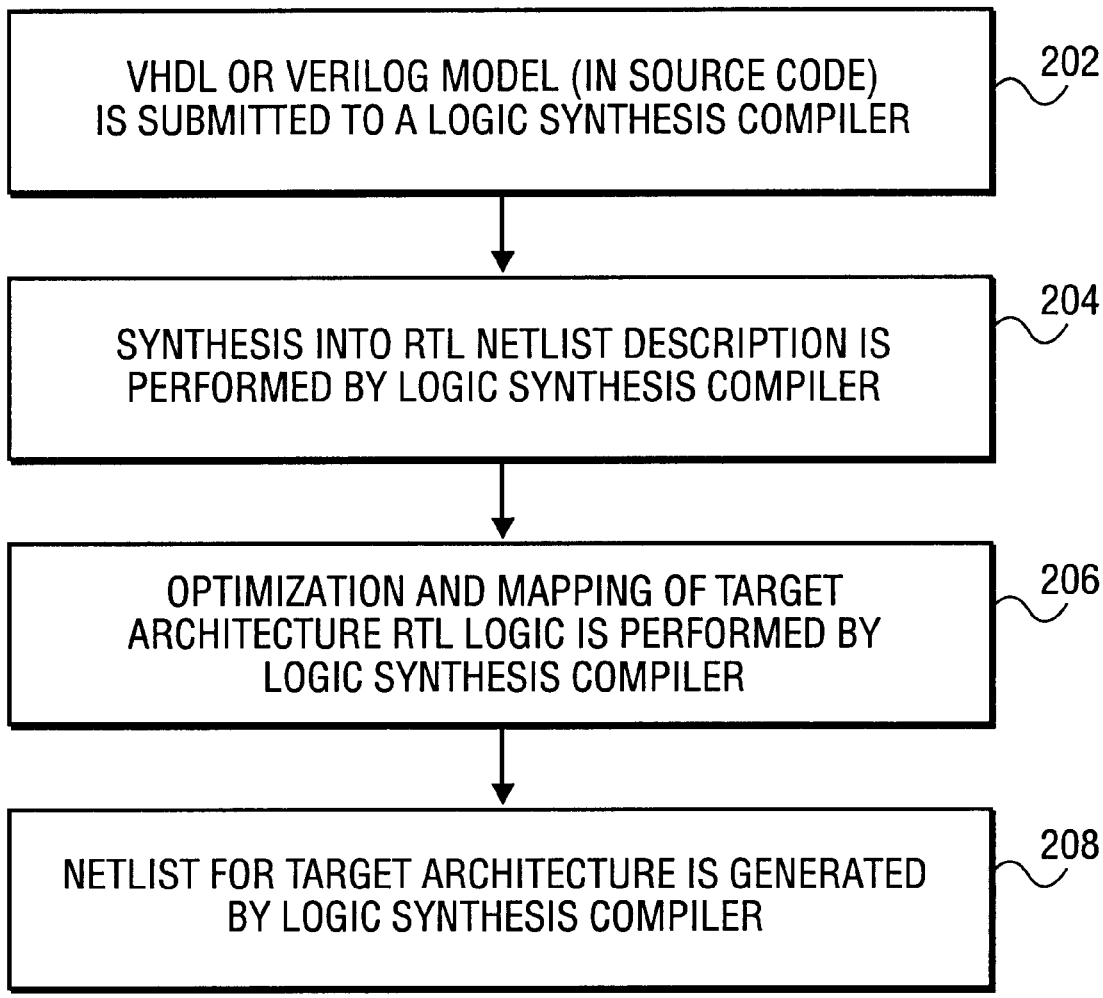
FIG. 2 is a flowchart illustrating the steps of an HDL synthesis process that is used with an embodiment of the present invention.

FIG. 2 is a flowchart illustrating the steps of an HDL synthesis process that is used with an embodiment of the present invention. FIG. 2 shows an example of an electronic design automation process that uses logic synthesis from an HDL description of a circuit to generate a detailed, gate level description that is used to create the circuit in a semiconductor integrated circuit (IC) or several IC's. The following description assumes that the IC will be fabricated using a library of building blocks (e.g., lookup tables, multiplexers, I/O flip-flops, and so on) that is used by a particular target architecture, such as an architecture established by a particular vendor (e.g., Xilinx) of programmable logic IC. However, it will be appreciated that certain embodiments of the present invention may be used in design processes which are not confined to using a particular library with a confined set of building blocks. That is, the present invention may be used with circuit design which is technology independent.

The process of FIG. 2 begins with the authoring of HDL source code that describes the circuit to be implemented. The authoring process involves writing HDL source code descriptions of the elements of the circuit, and is well described in the literature. See, for example, Verilog HDL: A Guide to Digital Design and Synthesis, Samir Palnithar, SunSoft Press, 1996; also see, A VHDL Synthesis Primer, J. Bhasher, Star Galaxy Publishing, 1996.

A completed version of the authored source code is then submitted to a logic synthesis compiler, step 202. This logic synthesis compiler is typically a computer program that operates on a general-purpose computer system, although in some embodiments, the computer system may be a dedicated, special purpose computer system. An example of a logic synthesis compiler is the program "Synplify®" from Synplicity, Inc. of Sunnyvale, Calif. The submitted HDL code is then compiled, in operation 204, into a particular level of description which is often an RTL (register transfer level) netlist. The RTL netlist will usually show registers and other logic interconnected to show the flow of data through a circuit that was described in the HDL code. In other examples of logic synthesis, the compiler may produce a gate level description of the circuit.

In operation 206, the logic synthesis compiler optimizes and maps the synthesized RTL netlist description from operation 204 into a target architecture. The target architecture is typically determined by a supplier of programmable IC's. An example of a target architecture is the programmed lookup tables (LUTs) and associated logic of the Xilinx XC4000 integrated circuit which is a field programmable gate array from Xilinx, Inc. of San Jose, Calif. Other examples of target architectures include those well known architectures in field programmable gate arrays and complex programmable logic devices from vendors such as Altera, Lucent Technologies, Advanced Micro Devices (AMD), and Lattice Semiconductor. The present invention may also be employed with ASICs (Application Specific Integrated Circuits). The mapping operation in operation 206 converts the synthesized RTL level description of the desired circuit into the equivalent circuit implemented using building blocks of the target architecture. The optimization operation in operation 206 optimizes the desired circuit, as implemented using those building blocks, by removing unnecessary logic circuits and other circuit elements.

Typically, the next operation, operation 208, of the process involves generating a netlist that serves as an input to the target architecture's place and route software tools (which is usually provided by the vendor which specifies the target architecture); these tools use the netlist to automatically specify the inputs to the vendor's IC in order to program the IC to produce the desired circuit. It will also be appreciated that, if no particular target architecture is specified (e.g., the designed circuit is to be technology independent), then operations 206 and 208 will usually produce a circuit schematic and associated netlist which may be used to construct an IC.

Digital circuits designed for use in VLSI devices contain upwards of hundreds of thousands of transistors which make up various different circuits such as logic gates, counters, arithmetic units, and so on. The use of an optimizer in the design of programmable logic devices using circuit synthesis tools is critical in reducing unnecessary circuitry and meeting circuit timing needs. Because circuit optimization typically involves reorganization of circuit elements, or even the removal of certain circuit elements, optimization processes typically result in the breakdown of circuit element hierarchies present in the original HDL or other programming source code used to define the circuit.

FIG. 3A is a table that illustrates the naming convention of object names by prior art logic synthesis compilers. In the prior art, the object names are generated by incrementing a global counter and concatenating the count with a fixed prefix. This global counter assigns a number or count for each expression in the entire source code rather than a portion of the source code. In FIG. 3A, the left column illustrates the HDL source code text expression. In one example, the text expression is an equation. The right column illustrates the prior art naming convention for the operators in the text expression after one synthesis execution. In this example, the fixed prefix is "I". In typical present logic synthesis programs, the ADD operator of the first HDL source code equation in the left column is mapped to the object name "I1" in the right column. Similarly, the MULTIPLY operator of the second HDL source code equation in the left column is mapped to the object name "I2" in the right column. As more operators are encountered in the HDL source code, their respective object names follow the same prefixed format concatenated with the next available counter value designated by the global counter.

FIG. 3B is a table that illustrates the same object naming convention by the prior art synthesis compilers after the HDL source code has been changed. In this example, the change in the HDL source code involves reversing the order of the equations illustrated in FIG. 3A. Note that the equations remain the same with the same operators and operands, as illustrated in the left column of FIG. 3B. However, since the naming convention is based on the fixed prefix and the incrementing global counter, the MULTIPLY operator is now mapped to the operator object name "I1". Correspondingly, the ADD operator is mapped to the operator object name "I2". Thus, the minor change in the source code has changed the names of the operators. When the size of the code is large, a change to the source code will necessitate renaming all subsequent objects. This makes it difficult to keep track of object names such as, for example, when there are sections of the subsequent source code that have already been analyzed or debugged.

In one embodiment of the present invention, the object names remain consistent and are re-producible across design revisions. This allows changes in one part of the HDL source code to affect only objects in the immediate vicinity of the change when the intention is not to affect the rest of the design. The objects that are not local to the change will retain the same name as they had in the previous synthesis before the change to the source code. By having consistent object names, the rest of the design is less likely to change across revisions. Furthermore, having the consistent object names minimize the effort required by a designer to understand the design changes.

In this case, using the example provided above, the object names of the operators generated during the first synthesis remain the same after the second synthesis even though the order of the expressions (e.g., equations) have been reversed (e.g., change to source code).

Figure 4:
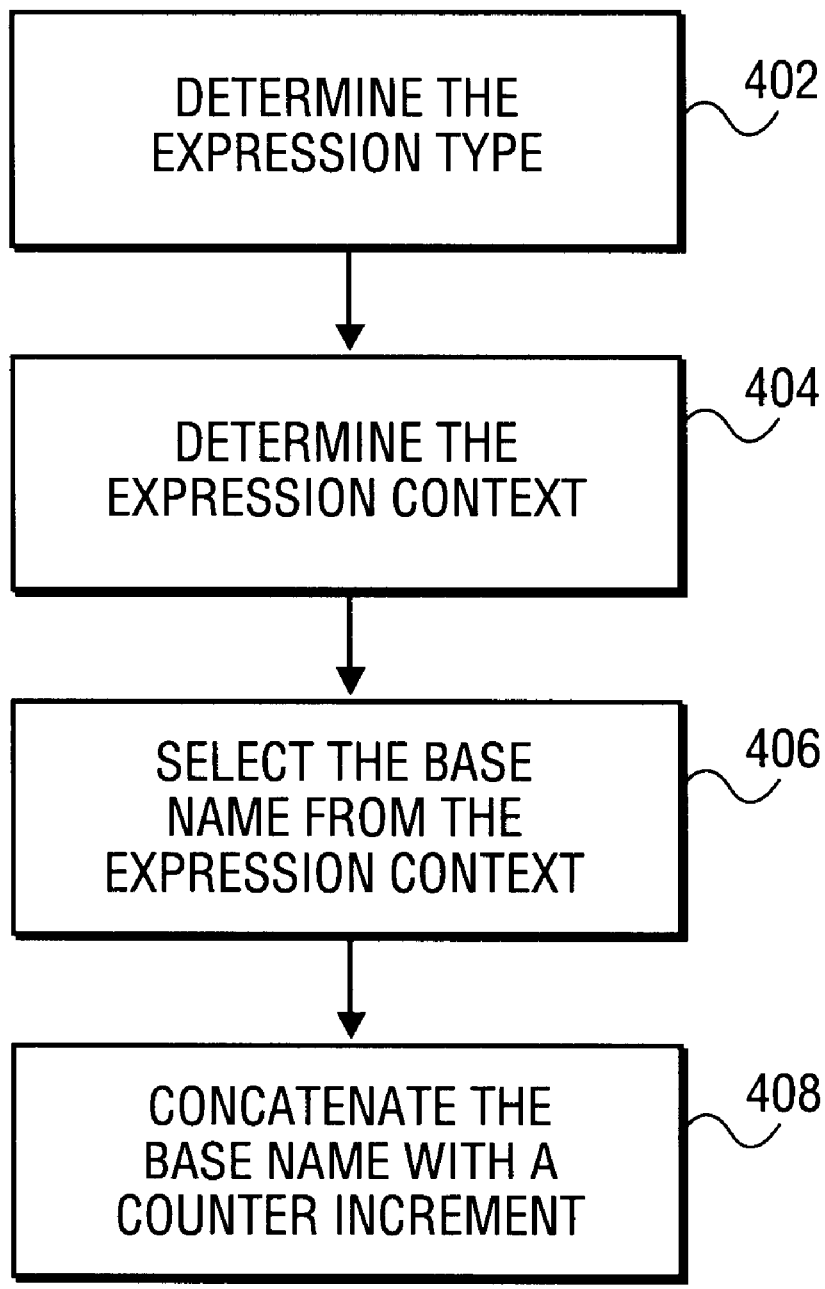
FIG. 4 is a flowchart that illustrates a method of determining object names using the context in which the objects are used, according to one embodiment of the present invention.

FIG. 4 is an exemplary flowchart that illustrates a method of determining the object names by analyzing the local context, according to one embodiment of the present invention. It will be appreciated that the method of FIG. 4 is used in conjunction with a process of logic synthesis, such as the process shown in FIG. 2. As stated above, with regard to FIG. 2, the circuit to be implemented is first described in HDL source code using HDL authoring tools. The logic synthesis converts, through an HDL compiler, the HDL source code to a RTL netlist structural model and FIG. 4 shows an exemplary method of the invention in which the HDL compiler performs this conversion.

During synthesis, the compiler generates objects to implement expressions within the HDL source code. Each object has an object name. When an object name is to be created, the invention determines the expression type (e.g., ADD, MULTIPLY, COMPARE, etc.) associated with the expressions, as shown in operation 402. From the expression type, the context of the expression is determined in order to generate the corresponding object name. In one embodiment, the invention derives the object names from the expressions themselves. The invention determines the context by first looking at the destination of the expression, as shown in operation 404. For example, an expression "A=B+C" will synthesize to an adder. The context of the adder is its destination. In this example, the destination is the operand "A" and therefore the name of the adder will be a unique name based on "A". This is the base name of the object name, as shown in operation 406. In one embodiment of the present invention, the object name is uniquely generated by concatenating the base name "A" and a number generated by a local counter (e.g., counter A) that is incremented each time "A" is used as a base name, as shown in operation 408. In the current example, the object name generated for the first adder expression is "A1". The counter A is used for counting objects which are part of or related to the expression. Other counters will typically be used for other expressions (e.g. counters B, C, etc.).

When the context destination described above can not be determined, a different base name is determined. For example, when the expression is a comparison (e.g., if C1=C2), there is no context destination. In this case, instead of the destination, the sources of the object are used to generate the unique object names. In one embodiment, the first source is used as the base name. In the comparison expression example, the object name generated for the first comparison expression is "C1" and is generated by concatenating the base name "C" with the next increment for the base name "C".

FIG. 5A is a table illustrating the application of the present invention to two exemplary source code equation expressions. Note that the two equation expressions are similar to the ones shown in FIG. 3A. During one synthesis, the ADD operator of the first expression is mapped to an operator object name with the base "A" and the corresponding increment for the base "A" (e.g., A3 for the third "A"). For this first expression, an A counter has provided a count to name objects for this expression. Similarly, the MULTIPLY operator of the second expression is mapped to an object name with the base "X" and the corresponding increment for the base "X" (e.g., X5 for the fifth "X"). For this second expression, a B counter has provided a count to name objects for this second expression.

FIG. 5B is a table illustrating the revised source code and consistent object names generated by the use of the present invention. In this example, the source code shown in FIG. 5A is modified such that the positions of the two equation expressions are reversed, as shown in FIG. 5B. In this case, the ADD operator is still mapped to the operator object name A3, and the MULTIPLY operator is still mapped to the operator object name X5. Thus the minor change in the source code has not changed the names of the operators.

In one embodiment, hierarchical names can be created by concatenating object names with a specified character that denotes hierarchy. Hierarchical names are used to identify objects in many electronic design automation (EDA) design tools. For example, a hierarchical name to represent an object can be "A.B.C" where the "." represents a level of hierarchy. Using the present invention, if any of the object names (e.g., "A", "B" or "C") changes, the hierarchical name changes as well. However, the change will remain local. Having the consistent names from one compilation to the next is very helpful in floor planning, partitioning, and etc.

One embodiment of the present invention may be a circuit design and synthesis Computer Aided Design (CAD) program which is implemented as a C program. This program is stored in a computer readable storage medium which may be a CD-ROM or a magnetic hard disk or an optical disk or any of the various alternative storage devices.

The steps of a method of the present invention may be implemented by a central processing unit (CPU) in a computer executing sequences of computer program instructions stored in a memory which may be considered to be this computer readable storage medium. The memory may be a random access memory (RAM), read-only memory (ROM), a persistent store, such as a mass storage device, or any combination of these devices. Execution of the sequences of instructions causes the CPU to perform operations according to the present invention. The instructions may be loaded into the memory of the computer from a storage device (e.g. a CD ROM, which is itself a computer readable storage medium) or from one or more other computer systems over a network connection. The instructions may be stored concurrently in several storage devices (e.g. DRAM and hard disk, as virtual memory). Consequently, execution of the instructions may be performed directly by the CPU. In other cases, the instructions may not be directly executable by the CPU. Under these circumstances, the instructions may be executed by causing the CPU to execute an interpreter that interprets the instructions, or by causing the CPU to execute instructions that convert the received instructions to instructions that can be directly executed by the CPU.

Figure 6:
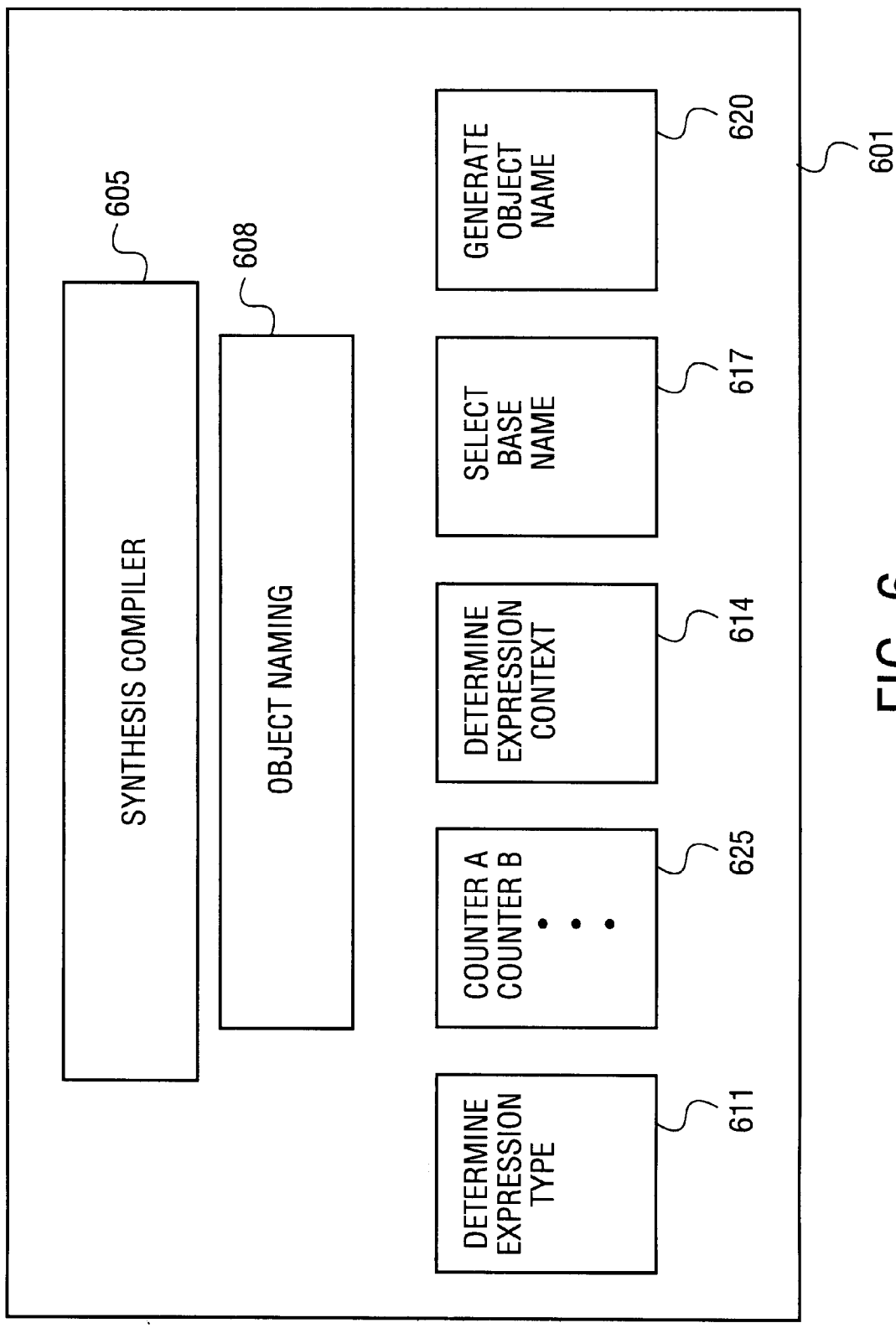
FIG. 6 shows an example, according to the invention, of a computer readable medium which includes executable instructions which, when executed by a digital processing system (e.g. a computer) cause the system to perform an example of a method according to the invention.

FIG. 6 shows one example of a computer readable medium which contains executable computer program instructions which when executed by a digital processing system cause the system to perform at least one example of a method according to the invention. The medium 601 includes the synthesis compiler instructions 605 that may be used to compile HDL text representations to create RTL netlist representations (which may be stored separately). The medium 601 may include an object-naming module 608 that is used by the synthesis compiler instructions 605 to generate object names. The medium 601 may further includes a module to determine the expression type 611, a module to determine the expression context 614, a module to select a base name 617, and a module to generate the object name 620. The medium 601 also includes a plurality of counters 625, such as counter A and counter B, which are used to name different objects as described above. Thus, for example, counter A is used to designate counts in a compilation process for objects for or related to a first expression, and counter B is used to designate counts in the compilation process for objects for or related to a second expression. It will be appreciated that the plurality of counters may be implemented as separate instantiations of software counters or as one software counter which is used to implement separate counters.

In other embodiments, hardwired circuitry may be used in place of, or in combination with, software instructions to implement the present invention. Thus, the present invention is not limited to any specific combination of hardware circuitry and software, nor to any particular source for the instructions executed by the computer.

In the foregoing, a system has been described for preserving correlation between circuit element source code representation and schematic representation during logic synthesis optimization. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
   receiving a text representation of a logic circuit, the text representation comprising of a plurality of expressions; and
   compiling the text representation, comprising:
      selecting a first object name for a first expression in the text representation, the first object name derived from the first expression and a first counter; and
      selecting a second object name for a second expression in the text representation, the second object name derived from the second expression and a second counter, the second expression following the first expression in the text representation.

2. The method of claim 1, further comprising:
   revising the first expression in the text representation to provide a revised first expression;
   compiling the text representation having the revised first expression, comprising:
      selecting a third object name for the revised first expression, the third object name derived from the revised first expression, the selection of the third object name having no effect on the second object name.

3. The method of claim 1 wherein the text representation is written in a hardware description language.

4. The method of claim 1, wherein compiling further comprising:
   generating a netlist using the first object name and the second object name, the netlist corresponding to the text representation.

5. The method of claim 2, wherein compiling the text representation having the revised first expression further comprising:
   generating a revised netlist using the third object name and the second object name, the revised netlist corresponding to the text representation having the revised first expression.

6. The method of claim 1, wherein deriving the object names from the expressions comprises:
   determining an expression type that corresponds to the expression;
   determining a context of the expression type; and
   selecting the object name based on the context.

7. The method of claim 6, wherein the expression type comprises an adder, a multiplication, or a comparison, and wherein the object names are generated by concatenating a base name and a counter increment associated with the expression type.

8. The method of claim 6 wherein the context of the expression type comprises an assignment or a reference, wherein the assignment has a destination operand and wherein the reference does not have a destination operand.

9. The method of claim 8, wherein the destination operand is used as the base name of the object name for the assignment expression type.

10. The method of claim 8, wherein a first operand of the reference expression type is used as the base name of the object name for the reference expression type.

11. A computer readable medium having stored thereon sequences of instructions which are executable by a digital processing system, and which, when executed by the digital processing system, cause the system to perform a method comprising:
   receiving a text representation of a logic circuit, the text representation comprising of a plurality of expressions; and
   compiling the text representation, comprising:
      selecting a first object name for a first expression in the text representation, the first object name derived from the first expression and a first counter; and
      selecting a second object name for a second expression in the text representation, the second object name derived from the second expression and a second counter, the second expression following the first expression in the text representation.

12. The computer readable medium of claim 11, further comprising:
revising the first expression in the text representation to provide a revised first expression;
compiling the text representation having the revised first expression, comprising:
selecting a third object name for the revised first expression, the third object name derived from the revised first expression, the selection of the third object name having no effect on the second object name.

13. The computer readable medium of claim 11 wherein the text representation is written in a hardware description language.

14. The computer readable medium of claim 11, wherein compiling further comprising:
generating a netlist using the first object name and the second object name, the netlist corresponding to the text representation.

15. The computer readable medium of claim 12, wherein compiling the text representation having the revised first expression further comprising:
generating a revised netlist using the third object name and the second object name, the revised netlist corresponding to the text representation having the revised first expression.

16. The computer readable medium of claim 11, wherein deriving the object names from the expressions comprises:
determining an expression type that corresponds to the expression;
determining a context of the expression type; and
selecting the object name based on the context.

17. The computer readable medium of claim 16, wherein the expression type comprises an adder, a multiplication, or a comparison, and wherein the object names are generated by concatenating a base name and a counter increment associated with the expression type.

18. The computer readable medium of claim 16 wherein the context of the expression type comprises an assignment or a reference, wherein the assignment has a destination operand and wherein the reference does not have a destination operand.

19. The computer readable medium of claim 18, wherein the destination operand is used as the base name of the object name for the assignment expression type.

20. The computer readable medium of claim 18, wherein a first operand of the reference expression type is used as the base name of the object name for the reference expression type.

21. A computer system, comprising:
a bus;
a data storage device coupled to the bus; and
a processor coupled to the data storage device, the processor operable to receive instructions which, when executed by the processor, cause the processor to perform a method comprising:
receiving a text representation of a logic circuit, the text representation comprising of a plurality of expressions; and
compiling the text representation, comprising: selecting a first object name for a first expression in the text representation, the first object name derived from the first expression and a first counter; and
selecting a second object name for a second expression in the text representation, the second object name derived from the second expression and a second counter, the second expression following the first expression in the text representation.

22. The computer system of claim 21, further comprising:
revising the first expression in the text representation to provide a revised first expression;
compiling the text representation having the revised first expression, comprising:
selecting a third object name for the revised first expression, the third object name derived from the revised first expression, the selection of the third object name having no effect on the second object name.

23. The computer system of claim 21, wherein the text representation is written in a hardware description language.

24. The computer system of claim 21, wherein compiling further comprising:
generating a netlist using the first object name and the second object name, the netlist corresponding to the text representation.

25. The computer system of claim 22, wherein compiling the text representation having the revised first expression further comprising:
generating a revised netlist using the third object name and the second object name, the revised netlist corresponding to the text representation having the revised first expression.

26. The computer system of claim 21, wherein deriving the object names from the expressions comprises:
determining an expression type that corresponds to the expression;
determining a context of the expression type; and
selecting the object name based on the context.

27. The computer system of claim 26, wherein the expression type comprises an adder, a multiplication, or a comparison, and wherein the object names are generated by concatenating a base name and a counter increment associated with the expression type.

28. The computer system of claim 26 wherein the context of the expression type comprises an assignment or a reference, wherein the assignment has a destination operand and wherein the reference does not have a destination operand.

29. The computer system of claim 28, wherein the destination operand is used as the base name of the object name for the assignment expression type.

30. The computer system of claim 28, wherein a first operand of the reference expression type is used as the base name of the object name for the reference expression type.

31. A method for naming objects in a synthesis compilation, comprising:
selecting a first object name for a first expression in text representation of a hardware circuit, the first object name derived from a first counter; and
selecting a second object name for a second expression in the text representation, the second object name derived from a second counter, the second expression following the first expression in the text representation.

32. The method of claim 31, further comprising:
revising the first expression in the text representation to provide a revised first expression;
compiling the text representation having the revised first expression, comprising:

selecting a third object name for the revised first expression, the third object name derived from the first counter, the selection of the third object name having no effect on the second object name.

33. The method of claim 31, wherein the object names are generated by concatenating the first counter or the second counter with a base name associated with an expression type of the corresponding expression.

34. The method of claim 32, further comprising generating a netlist using the third object name and the second object name.

35. The method of claim 33, wherein the expression type comprises an adder, a multiplication, or a comparison.

36. A method, comprising:
compiling a text representation of a logic circuit, said text representation comprising a plurality of expressions that each express at least one logic operation performed by said logic circuit, said plurality of expressions further comprising at least one expression having more than one logic operation, said compiling comprising deriving different object names for each of said logic operations within said expression having more than one logic operation, each of said different object names being derived from:
   a) said expression having more than one logic operation; and,
   b) a counter value maintained for said expression having more than one logic operation that increments upon an object name being derived from said expression having more than one logic operation.

37. The method of claim 36 further comprising deriving each of said different object names by concatenating a destination of said expression having more than one logical operation with said counter value.

38. The method of claim 36 wherein said text representation is written in a hardware description language.

39. The method of claim 38 wherein said hardware description language is VHDL.

40. The method of claim 38 wherein said hardware description language is Verilog.

41. The method of claim 36 wherein said compiling produces a netlist of said logic circuit.

42. The method of claim 44 wherein said netlist is an RTL netlist.

43. The method of claim 36 further comprising revising said expression having more than one logic operation to produce a second text representation of said logic circuit.

44. The method of claim 43 further comprising compiling said second text representation, said compiling said second text representation comprising deriving different object names for each of said logic operations within said revised expression having more than one logic operation, each of said different object names being derived from:
   a) said revised expression having more than one logic operation; and,
   b) a counter value maintained for said revised expression having more than one logic operation that increments upon an object name being derived from said revised expression having more than one logic operation.

45. The method of claim 44 wherein said compiling said second text representation causes new object names to be generated for said revised expression having more than one logic operation as compared to said expression having more than one logic operation.

46. The method of claim 44 wherein said compiling said second text representation does not generate a new object name for any of those of said plurality of expressions that were not revised.

47. The method of claim 44 wherein one of said logic operations of said revised text expression having more than one logic operation is adding.

48. The method of claim 44 wherein one of said logic operations of said revised text expression having more than one logic operation is comparing.

49. The method of claim 44 wherein one of said logic operations of said revised text expression having more than one logic operation is multiplying.

50. A computer readable medium having stored thereon a sequences of instructions which are executable by a digital processing system, and which, when executed by said digital processing system, cause said system to perform a method, said method comprising:
compiling a text representation of a logic circuit, said text representation comprising a plurality of expressions that each express at least one logic operation performed by said logic circuit, said plurality of expressions further comprising at least one expression having more than one logic operation, said compiling comprising deriving different object names for each of said logic operations within said expression having more than one logic operation, each of said different object names being derived from:
   a) said expression having more than one logic operation; and,
   b) a counter value maintained for said expression having more than one logic operation that increments upon an object name being derived from said expression having more than one logic operation.

51. The computer readable medium of claim 50 where the method further comprises deriving each of said different object names by concatenating a destination of said expression having more than one logical operation with said counter value.

52. The computer readable medium of claim 50 wherein said text representation is written in a hardware description language.

53. The computer readable medium of claim 52 wherein said hardware description language is VHDL.

54. The computer readable medium of claim 52 wherein said hardware description language is Verilog.

55. The computer readable medium of claim 50 wherein said compiling produces a netlist of said logic circuit.

56. The computer readable medium of claim 55 wherein said netlist is an RTL netlist.

57. The computer readable medium of claim 50 wherein said method further comprises compiling a second text representation of said logic circuit, said second text representation having a revised version of said expression having more than one logic operation, said revised version also having more than one logic operation, said compiling said second text representation comprising deriving different object names for each of said logic operations within said revised version, each of said different object names being derived from:

a) said revised version; and, b) a counter value maintained for said revised version that increments upon an object name being derived from said revised version.

58. The computer readable medium of claim 57 wherein said compiling said second text representation causes new object names to be generated for said revised version as compared to said expression having more than one logic operation.

59. The computer readable medium of claim 57 wherein said compiling said second text representation does not generate a new object name for any of those of said plurality of expressions that were not revised.

60. The computer readable medium of claim 57 wherein one of said logic operations of said revised version is adding.

61. The computer readable medium of claim 57 wherein one of said logic operations of said revised version is comparing.

62. The computer readable medium of claim 57 wherein one of said logic operations of said revised version, is multiplying.

* * * * *